(12) United States Patent
Frohberg et al.

(10) Patent No.: US 9,159,661 B2
(45) Date of Patent: Oct. 13, 2015

(54) INTEGRATED CIRCUITS WITH CLOSE ELECTRICAL CONTACTS AND METHODS FOR FABRICATING THE SAME

(71) Applicant: GLOBALFOUNDRIES, Inc., Grand Cayman (KY)

(72) Inventors: Kai Frohberg, Niederau (DE); Peter Moll, Dresden (DE); Heike Scholz, Hirschfeld (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/083,797

(22) Filed: Nov. 19, 2013

(65) Prior Publication Data

US 2015/0137385 A1     May 21, 2015

(51) Int. Cl.
| | |
|---|---|
| *H01L 23/58* | (2006.01) |
| *H01L 23/532* | (2006.01) |
| *H01L 29/772* | (2006.01) |
| *H01L 29/92* | (2006.01) |
| *H01L 21/20* | (2006.01) |
| *H01L 23/498* | (2006.01) |
| *H01L 21/321* | (2006.01) |
| *H01L 21/768* | (2006.01) |

(52) U.S. Cl.
CPC ...... *H01L 23/49827* (2013.01); *H01L 21/3212* (2013.01); *H01L 21/76816* (2013.01)

(58) Field of Classification Search
CPC ............................ H01L 27/1203; H01L 28/20
USPC ........... 257/753; 430/316, 311, 313; 438/197, 438/629, 636, 597, 644
See application file for complete search history.

(56) References Cited

U.S. PATENT DOCUMENTS

| | | | | |
|---|---|---|---|---|
| 2004/0180297 | A1* | 9/2004 | Yoon et al. | 430/316 |
| 2006/0024954 | A1* | 2/2006 | Wu et al. | 438/629 |
| 2007/0197014 | A1* | 8/2007 | Jeon et al. | 438/597 |
| 2009/0051034 | A1* | 2/2009 | Pai et al. | 257/753 |
| 2009/0258318 | A1* | 10/2009 | Chan | 430/312 |
| 2010/0038723 | A1* | 2/2010 | Babich et al. | 257/384 |
| 2011/0074039 | A1* | 3/2011 | Zhang et al. | 257/774 |
| 2012/0184080 | A1* | 7/2012 | Lukaitis et al. | 438/384 |
| 2013/0273701 | A1* | 10/2013 | Ochimizu et al. | 438/197 |
| 2014/0273470 | A1* | 9/2014 | Lin et al. | 438/702 |

* cited by examiner

*Primary Examiner* — Kimberly Rizkallah
*Assistant Examiner* — Brian Turner
(74) *Attorney, Agent, or Firm* — Ingrassia Fisher & Lorenz, P.C.

(57) ABSTRACT

Integrated circuits with close electrical contacts and methods for fabricating such integrated circuits are provided. The method includes forming a first and a second contact in an interlayer dielectric, and forming a recess between the first and second contact. A etch mask is formed overlying the interlayer dielectric, and the etch mask is removed from over a recess mid-point. A center contact is formed in the interlayer dielectric at the recess mid-point.

16 Claims, 4 Drawing Sheets

INTEGRATED CIRCUITS WITH CLOSE ELECTRICAL CONTACTS AND METHODS FOR FABRICATING THE SAME

TECHNICAL FIELD

The technical field generally relates to integrated circuits and methods for fabricating integrated circuits, and more particularly relates to integrated circuits with electrical contacts positioned very close together, and methods for fabricating the same.

BACKGROUND

Over time, integrated circuits are becoming smaller and have increased capabilities. The production of smaller integrated circuits requires the development of smaller electronic components, and closer spacing of those electronic components. In traditional integrated circuits, electrical contacts are formed through an insulating cover layer, often called an interlayer dielectric, to connect the electronic components in a desired manner. Some electronic components have multiple electrical contacts, such as a field effect transistor (FET) that may have contacts to its source, its drain, and its gate. The contacts must be spaced very close together to make the desired electrical connections.

Electrical contacts typically physically connect electrical devices on one layer of the integrated circuit to interconnect or metallization layers spaced from the devices by one or more of the interlayer dielectric layers. There may be several layers of interconnect lines separated by interlayer dielectrics, and there may be transistors, resistors, and other electronic components separated by various other layers of interlayer dielectric as well. The contacts are formed by etching a via or hole in the interlayer dielectric material, and then depositing conductive material in the via.

The vias are positioned by patterning a photoresist layer to expose desired areas of the interlayer dielectric, and using the patterned photoresist as a mask for the etching process. In a traditional process, the contacts are formed by depositing a layer of photoresist, exposing desired area of the photoresist to light to change the chemical nature of the photoresist, and then removing the photoresist from either the areas exposed to the light or the areas protected from the light. A mask is used to protect selected areas of the photoresist from light, and to allow light to pass through to other areas. When the mask is designed to transmit light through small areas that approach the wavelength of the light, the light refracts or bends when it passes through the mask and contacts photoresist that the mask is intended to shield. The result in a resolution limit at which the photoresist pattern cannot be scaled below. Shorter frequency light can be used to lower the resolution limit, but there is a higher cost for using shorter frequency light. Even with short frequency light, the spacing of the vias is limited by the resolution limit. This resolution limit, and the associated limit on how close electrical contacts can be placed, can prevent the production of integrated circuits with electronic components packed beyond a certain distance from each other.

Accordingly, it is desirable to develop methods and systems for manufacturing contacts close together. In addition, it is desirable to develop methods and systems for contacts spaced closer together than the resolution limit of the photoresist used. Furthermore, other desirable features and characteristics of the present embodiment will become apparent from the subsequent detailed description and the appended claims, taken in conjunction with the accompanying drawings and this background.

BRIEF SUMMARY

Integrated circuits with close electrical contacts and methods for fabricating such integrated circuits are provided. In an exemplary embodiment, a method is provided for producing an integrated circuit. The method includes forming a first and a second contact in an interlayer dielectric, and forming a recess between the first and second contact. A etch mask is formed overlying the interlayer dielectric, and the etch mask is removed from over a recess mid-point. A center contact is formed in the interlayer dielectric at the recess mid-point.

In another exemplary embodiment, a method for fabricating an integrated circuit includes forming a contact photoresist overlying an interlayer dielectric, where the contact photoresist has a resolution limit. First and second contacts are formed in the interlayer dielectric, where a first to second contact distance is less than twice the resolution limit. A central contact is then formed within the interlayer dielectric between the first and second contacts.

In a further exemplary embodiment, an integrated circuit includes an interlayer dielectric and a plurality of contacts within the interlayer dielectric. The plurality of contacts include a first contact, a second contact, and a central contact positioned between the first and second contacts. A first to center contact distance is less than about 80 nanometers.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the application and uses of the embodiment described. Furthermore, there is no intention to be bound by any theory presented in the preceding background or the following detailed description.

Novel methods and integrated circuits are contemplated with contacts spaced closer together than conventional integrated circuits. Reductions in the size of some integrated circuits are limited by how close the electrical contacts are spaced together. The spacing of conventional contacts is limited by the resolution limit of the photoresist used to pattern the contact locations. The contacts are electrically connected to electronic components, so closer spacing of the contacts allows for either closer spacing of the electronic components or smaller electronic components, which can result in smaller integrated circuits. The method for producing the closely spaced contacts uses a plurality of electronic components covered with an interlayer dielectric. First and second contacts are formed in the interlayer dielectric in the standard manner, where a first to second contact distance is about the photoresist resolution limit, and less than twice the photoresist resolution limit. A recess is formed in the interlayer dielectric between the first and second contact. A etch mask is formed overlying the interlayer dielectric, both within and outside of the recess, and the etch mask is thinnest at the midpoint in the recess. The etch mask is then etched away until the interlayer dielectric at the midpoint of the recess is exposed, but the rest of the etch mask remains in place. A center contact is then formed at the exposed portion of the interlayer dielectric in the usual manner, so the center contact is half way between the first and second contacts, and the distance from the center contact to the first contact or to the second contact is about half the photoresist resolution limit. This produces three contacts within the space of the photoresist resolution limit, instead of two, which allows for closer spacing of the electrical components connected to the contacts.

Figure 1:
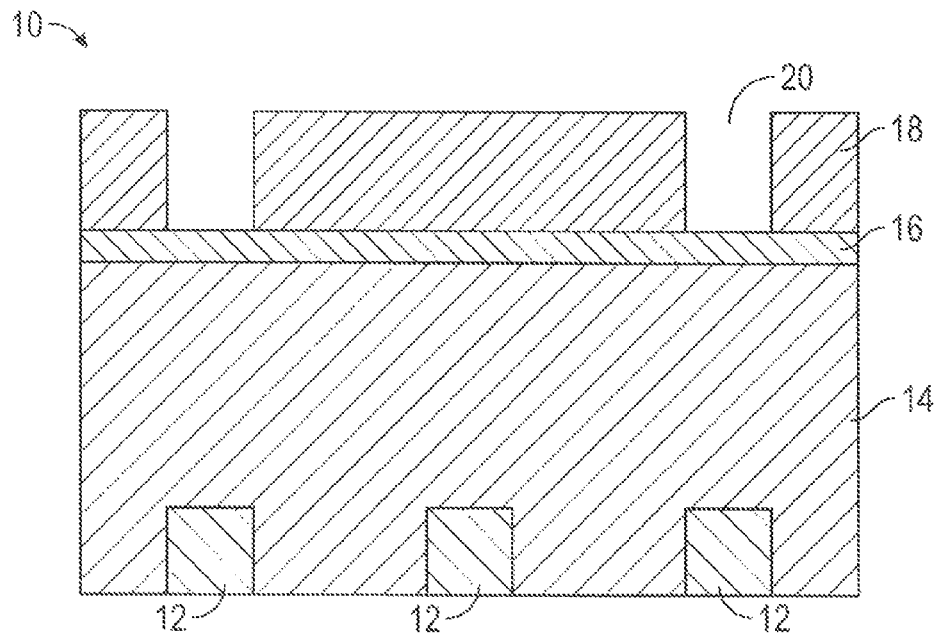
FIGS. 1-8 illustrate, in cross sectional views, a portion of an integrated circuit and methods for its fabrication in accordance with exemplary embodiments.

Referring to FIG. 1, in accordance with an exemplary embodiment, an integrated circuit 10 includes a plurality of contact points 12, where the contact points 12 are electrically connected to, or are a part of, one or more electronic components. The electronic components can be transistors, resistors, capacitors, and other devices used in the integrated circuit 10. The contact points 12 are silicided in some embodiments, and the integrated circuit uses electrical connections between the electronic components in a predesigned manner. An interlayer dielectric 14 overlies the contact points 12, including the electronic components. As used herein, the term "overlying" means "over" such that an intervening layer may lie between the interlayer dielectric 14 and the contact points 12, and "on" such the interlayer dielectric 14 physically contacts the contact points 12. The interlayer dielectric 14 is an insulator such as silicon oxide or silicon nitride, and the interlayer dielectric 14 may include one, two, or more layers with the same or varying compositions.

In an optional embodiment, a hard mask 16 is deposited overlying the interlayer dielectric 14, where the hard mask 16 is silicon nitride in some embodiments. The hard mask 16 can be deposited by low pressure chemical vapor deposition using ammonia and dichlorosilane. A contact photoresist 18 is deposited overlying the interlayer dielectric 14, and the hard mask 16 if present, and is patterned to form a plurality of contact gaps 20 positioned over the contact points 12. The hard mask 16 serves as an etch mask during subsequent etching steps. The contact photoresist 18 (and other photoresist layers described below) are deposited by spin coating, and patterned by exposure to light or other electromagnetic radiation through a mask with transparent sections and opaque sections. The desired locations are removed with an organic solvent.

The contact photoresist 18 has a resolution limit, so the contact gaps 20 are no closer together than the resolution limit, and in some embodiments the contact gaps 20 are less than about twice the resolution limit. The resolution limit varies with the frequency of light and the thickness of the layer of contact photoresist 18. For contact printing with photoresist, the resolution limit is determined by the equation: $R=(3/2)(\lambda z/2)^{0.5}$ where $\lambda$ is the wavelength of the light source, and z is the thickness of the photoresist layer. The resolutions limits for different light sources and varying thicknesses of photoresist are listed in the table below.

| | Photoresist Resolution Limits, in Nanometers | | |
| --- | --- | --- | --- |
| Light wavelength | Resolution with 300 nanometer thick photoresist | Resolution with 1,000 nanometer thick photoresist | Resolution with 3,000 nanometer thick photoresist |
| 440 | 390 | 700 | 1,200 |
| 370 | 350 | 650 | 1,100 |
| 250 | 290 | 530 | 920 |
| 190 | 250 | 460 | 800 |

Different types of photoresist are available, and the type of photoresist is matched to the frequency of light used. The chemical reaction that changes the photoresist is typically induced by a specific frequency of light, so the type of photoresist and the frequency of light are matched. Therefore, depending on the type of photoresist, the thickness of the photoresist, and the frequency of light used, the resolution limit of the photoresist can vary from about 80 nanometers to well over 2,000 nanometers. The resolution limit of the contact photoresist 18 varies, but some representative values include about 100 nanometers, about 300 nanometers, about 500 nanometers, and about 1,000 nanometers.

Once the contact gaps 20 are formed, vias are etched through the interlayer dielectric 14, and the hard mask 16 if present, such that the vias reach the contact points 12. In an exemplary embodiment with a silicon nitride hard mask 16 and a silicon oxide interlayer dielectric 14, the vias are etched in a two step process. The hard mask 16 is removed with a plasma etch using hydrogen and nitrogen trifluoride, and the interlayer dielectric 14 is removed with a reactive ion etch using carbon tetrafluoride in a hydrogen plasma. The contact photoresist 18 is then removed with an oxygen containing plasma, and the remaining hard mask 16 is removed with a wet etch using hot phosphoric acid.

Figure 2:
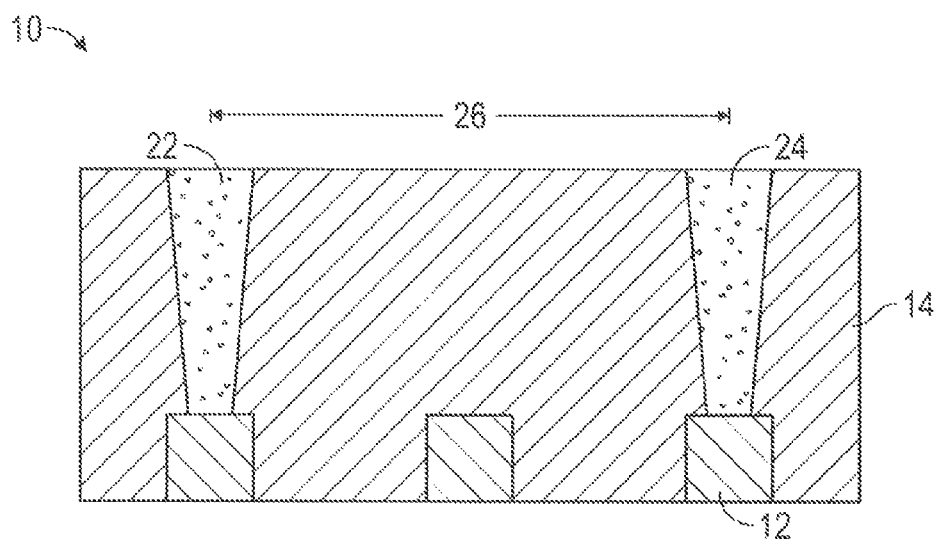

Referring now to FIG. 2, a plurality of contacts are formed through the interlayer dielectric 14 to the contact points 12, where the plurality of contacts include a first contact 22 and a second contact 24. In an exemplary embodiment, the first and second contacts 22, 24 include an adhesion layer, a barrier layer, and a plug (not shown), which are sequentially deposited. For example, an adhesion layer of titanium is formed by low pressure chemical vapor deposition of titanium pentachloride, a barrier layer of titanium nitride is formed by chemical vapor deposition of titanium tetrabromide and ammonia, and a plug of tungsten is formed by chemical vapor deposition reaction of tungsten hexafluoride and hydrogen. Other types of contacts are also possible, such as copper or other conductive materials. There may be an overburden from the deposition of the first and second contacts 22, 24, and the overburden is removed by chemical mechanical planarization. A first to second contact distance, as measured from the mid-point of the first and second contacts 22, 24, is no less than the contact photoresist resolution limit, and is less than twice the contact photoresist resolution limit.

Figure 3:
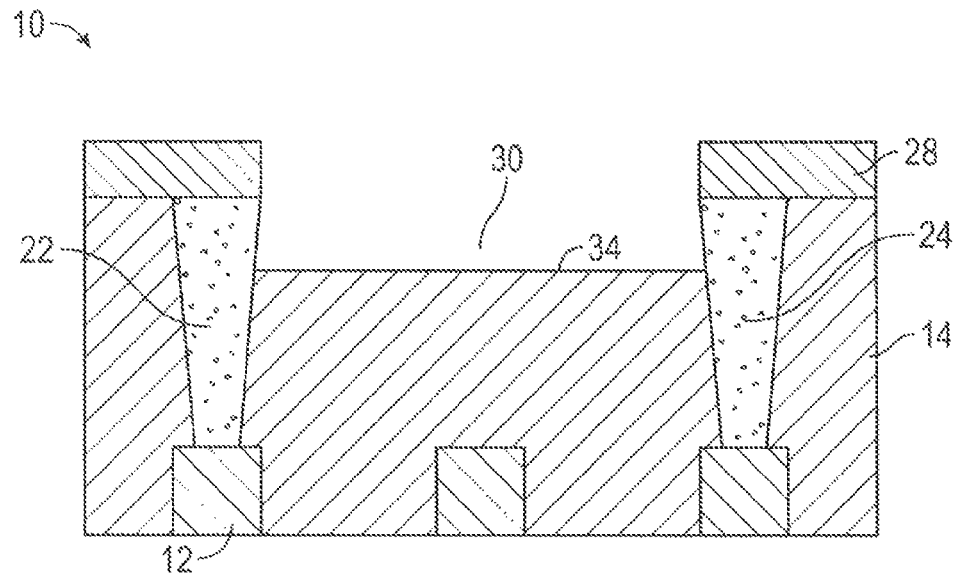

Referring now to the exemplary embodiment illustrated in FIG. 3, a recess photoresist 28 is formed overlying the interlayer dielectric 14 and the first and second contacts 22, 24. The recess photoresist 28 is patterned and developed, as described above, to expose the interlayer dielectric 14 between the first and second contacts 22, 24. The exposed interlayer dielectric 14 is then partially removed to form a recess 30 between the first and second contacts 22, 24. In an exemplary embodiment where the interlayer dielectric is silicon oxide, the recess 30 is formed by etching the interlayer dielectric with liquid hydrofluoric acid, or with a reactive ion etch using carbon tetrafluoride in a hydrogen plasma. The duration of the etch is limited to control the depth of the recess 30.

Figure 4:
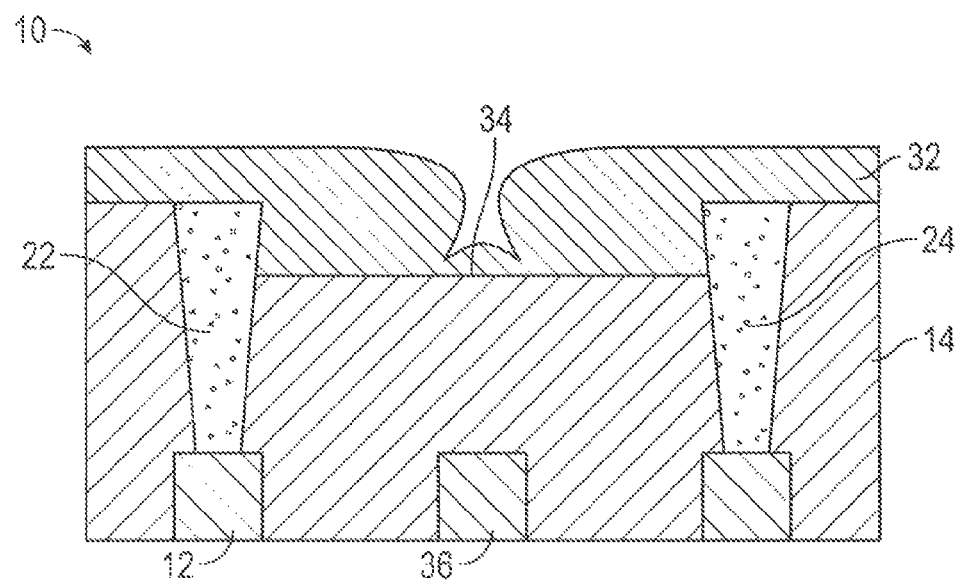

An etch mask 32 is formed overlying the interlayer dielectric 14 and the first and second contacts 22, 24, as illustrated in FIG. 4. A variety of materials can be used for the etch mask 32, such as silicon nitride formed by low pressure chemical vapor deposition using ammonia and dichlorosilane, or carbon doped silicon oxide formed by plasma enhanced chemical vapor deposition using trimethyl silane and oxygen. The etch mask 32 can be formed non-conformally, and the etch mask 32 is thinner at a recess mid-point 34 than elsewhere. The etch mask 32 may be thinnest at the recess mid-point 34 due to sidewalls forming along the exposed side surfaces of the first and second contacts 22, 24, so the sidewalls partially block or shield the recess mid-point 34, but other mechanisms may be responsible for the thin etch mask 32 at the recess mid-point 34 as well. The recess mid-point 34 is half way between the first and second contacts 22, 24 and is aligned over a center contact point 36, where the center contact point 36 is one of the plurality of contact points 12. The electronic components associated with the contact points 12 are designed and spaced for a contact at the recess mid-point 34, which is positioned half way between the first and second contacts 22, 24.

Figure 5:
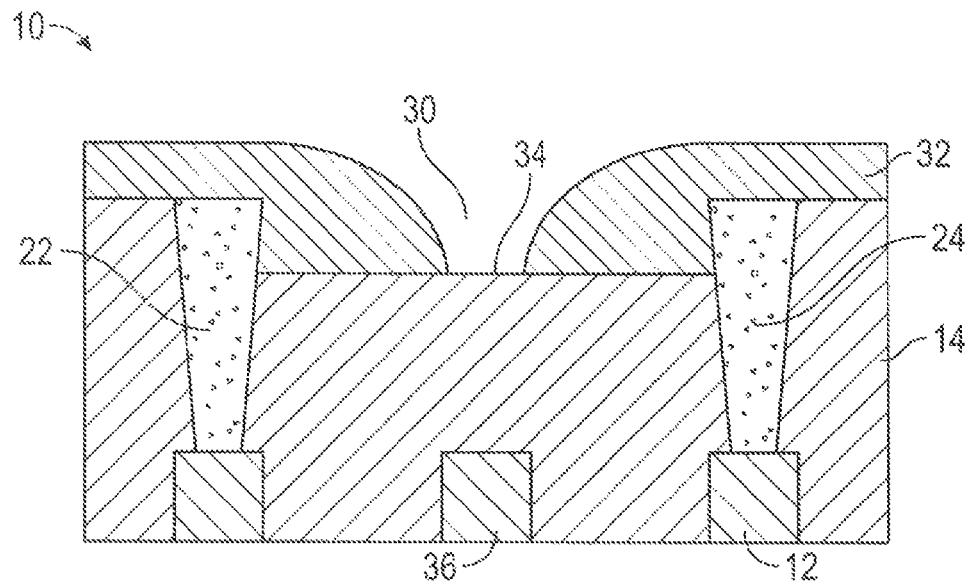

Referring now to FIG. 5, the etch mask 32 is partially removed to expose the interlayer dielectric 14 at the recess mid-point 34. In an exemplary embodiment, the etch mask 32 is partially removed by anisotropic etching, where the etchant depends on the material of the etch mask 32. In embodiments with a silicon nitride etch mask 32, a reactive ion etch with silicon hexafluoride and oxygen can be used. In embodiments with a carbon doped silicon oxide etch mask 32, a plasma etch with ammonia and hexafluoro ethane can be used. The result is the remaining etch mask 32 overlies (1) the interlayer dielectric 14 outside of the recess 30, (2) the first and second contacts 22, 24, and (3) the interlayer dielectric 14 on the side portions of the recess 30, while leaving the recess mid-point 34 exposed.

Figure 6:
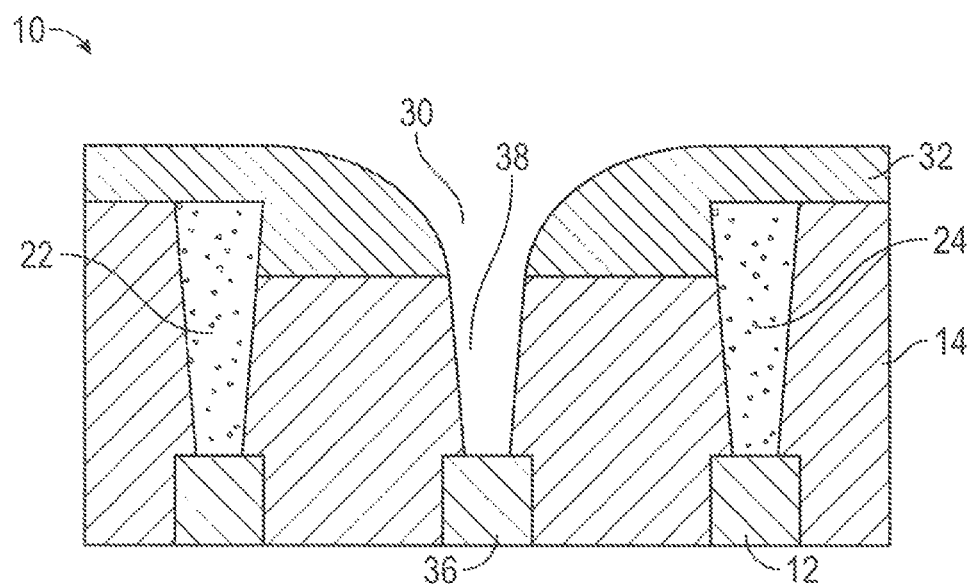

A trench 38 is then formed in the interlayer dielectric 14 at the recess mid-point 34, as illustrated in FIG. 6. The trench 38 extends to the center contact point 36, so the top surface of the center contact point 36 is exposed. In an exemplary embodiment with silicon oxide as the interlayer dielectric 14, the trench 38 is formed by an anisotropic reactive ion etch using carbon tetrafluoride in a hydrogen plasma. Appropriate etchants are used in embodiments where the interlayer dielectric 14 is something other than silicon oxide.

Figure 7:
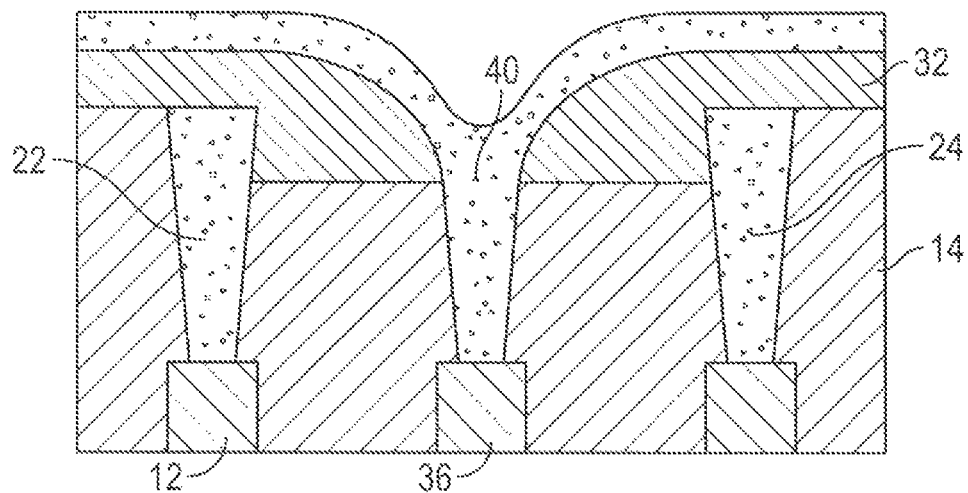

Reference is now made to the exemplary embodiment illustrated in FIG. 7, with continuing reference to FIG. 6. A center contact 40 is formed within the trench 38 in the interlayer dielectric 14. In some embodiments, the center contact 40 can be titanium, with an adhesion layer and a barrier layer (not shown), as described above. However, in alternate embodiments the center contact 40 is copper or other conductive materials. The center contact 40 is formed using methods known to those skilled in the art. The process of forming the center contact 40 may leave an overburden extending over the etch mask 32.

Figure 8:
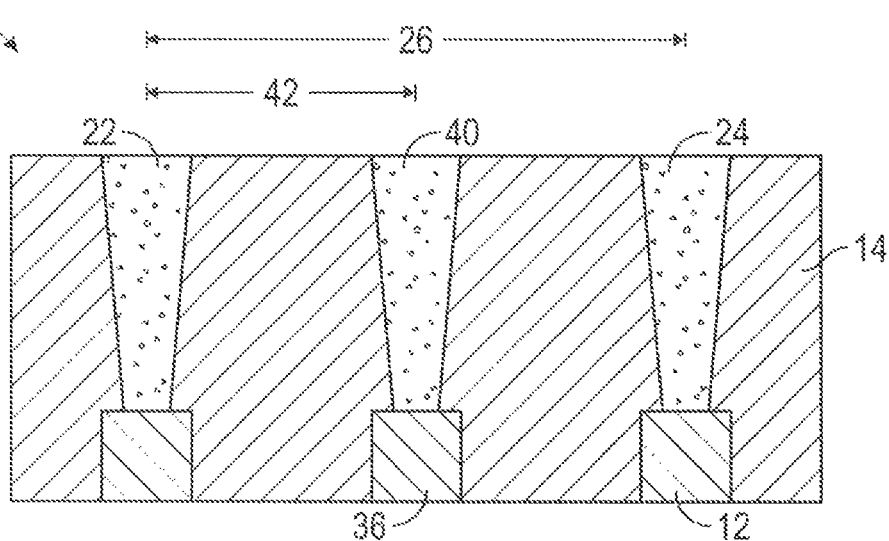

Any overburden from the center contact 40 is removed by chemical mechanical planarization, as illustrated in FIG. 8. The chemical mechanical planarization can be continued to remove the etch mask 32, and to level the first and second contacts 22, 24 with the center contact 40. The chemical mechanical planarization removes an upper portion of the interlayer dielectric 14, so the area between the first and second contacts 22, 24 is no longer recessed relative to the interlayer dielectric 14 outside of the first and second contacts 22, 24. The thickness of the interlayer dielectric 14 is increased during formation in some embodiments to account for the material removed when leveling the first, second, and center contacts 22, 24, 40, but traditional thicknesses of interlayer dielectric 14 are used in other embodiments.

The center contact 40 is equidistant from the first and second contacts 22, 24, so a center to first contact distance 42 is the same as a center to second contact distance, and is half the first to second contact distance 26. The first to second contact distance 26 is determined by the distance between the contact gaps 20 illustrated in FIG. 1, which was less than twice the photoresist resolution limit. Therefore, the center to first contact distance 42 is less than the photoresist resolution limit. The close spacing of the first, center, and second contacts 22, 40, 24 enables very close spacing of electronic components connected to the contact points 12.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of producing an integrated circuit comprising:
    forming a first contact and a second contact in an interlayer dielectric;
    forming a recess in the interlayer dielectric between the second contact and the first contact, wherein forming the recess in the interlayer dielectric comprises;
    depositing a recess photoresist overlying the interlayer dielectric;
    removing the recess photoresist from over the interlayer dielectric between the first contact and the second contact; and
    etching the recess between the first contact and the second contact;
    forming an etch mask overlying the interlayer dielectric;
    removing the etch mask from over a recess mid-point;
    forming a trench in the interlayer dielectric at the recess mid-point after forming the etch mask; and
    forming a center contact in the trench.

2. The method of claim 1 wherein forming the etch mask overlying the interlayer dielectric further comprises:
    depositing silicon nitride overlying the interlayer dielectric.

3. The method of claim 1 wherein forming the etch mask overlying the interlayer dielectric further comprises:
    depositing silicon oxide doped with carbon overlying the interlayer dielectric.

4. The method of claim 1 wherein removing the etch mask from over the recess mid-point further comprises;
    removing the etch mask from over the recess mid-point while leaving the etch mask overlying the first contact and the second contact.

5. The method of claim 1 further comprising;
    leveling the interlayer dielectric, the first contact, the second contact, and the center contact by chemical mechanical planarization.

6. The method of claim 1 wherein forming the first contact and the second contact further comprises:
    forming the first contact and the second contact wherein a first to second contact distance is no more than 100 nanometers.

7. The method of claim 1 wherein removing the etch mask from over the recess mid-point further comprises removing the etch mask from over the recess mid-point by anisotropic etching.

8. A method of producing an integrated circuit comprising:
    forming a contact photoresist overlying an interlayer dielectric, wherein the contact photoresist has a resolution limit;

forming a first contact and a second contact in the interlayer dielectric, wherein a first to second contact distance is less than twice the resolution limit;

depositing a recess photoresist overlying the interlayer dielectric;

removing the recess photoresist from over the interlayer dielectric between the first contact and the second contact;

etching a recess in the interlayer dielectric between the first contact and the second contact; and forming a center contact within the interlayer dielectric between the first contact and the second contact, wherein the center contact is formed after the first contact and the second contact are formed.

9. The method of claim 8 further comprising:

forming an etch mask overlying the interlayer dielectric, the first contact, and the second contact.

10. The method of claim 9 wherein forming the etch mask further comprises forming the etch mask from silicon nitride.

11. The method of claim 9 wherein forming the etch mask further comprises forming the etch mask from silicon oxide doped with carbon.

12. The method of claim 9 further comprising:

removing the etch mask from over a recess mid-point, wherein the recess mid-point is between the first contact and the second contact.

13. The method of claim 8 wherein forming the contact photoresist further comprises forming the contact photoresist wherein the resolution limit is no more than 500 nanometers.

14. The method of claim 8 wherein forming the contact photoresist further comprises forming the contact photoresist wherein the resolution limit is no more than about 300 nanometers.

15. The method of claim 8 wherein forming the contact photoresist further comprises forming the contact photoresist wherein the resolution limit is no more than about 100 nanometers.

16. The method of claim 8 further comprising:

leveling the interlayer dielectric, the first contact, the second contact, and the center contact.

* * * * *